(12) United States Patent
Wang et al.

(10) Patent No.: US 6,277,754 B1
(45) Date of Patent: *Aug. 21, 2001

(54) METHOD OF PLANARIZING DIELECTRIC LAYER

(75) Inventors: Brian Wang, Chung-Li; Chih-Ching Hsu, Hsinchu, both of (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/067,548

(22) Filed: Apr. 27, 1998

(30) Foreign Application Priority Data

Mar. 11, 1998 (TW) ................................................ 87103550

(51) Int. Cl.⁷ ...................... H01L 21/311; H01L 21/4763
(52) U.S. Cl. .......................... 438/699; 438/698; 438/624; 438/626; 438/631; 438/632; 438/958

(58) Field of Search ..................................... 438/697, 723, 438/699, 958, 698, 645, FOR 493, 624, 626, 631, 632, 646

(56) References Cited

U.S. PATENT DOCUMENTS

| | | | |
|---|---|---|---|
| 5,217,566 | * 6/1993 | Pasch et al. | 438/723 |
| 5,656,556 | * 8/1997 | Yang | 438/698 |
| 5,733,818 | * 3/1998 | Goto | 438/699 |
| 5,913,131 | * 6/1999 | Hossain et al. | 438/423 |
| 5,915,175 | * 6/1999 | Wise | 438/759 |
| 5,924,007 | * 6/1999 | Liang et al. | 438/626 |

* cited by examiner

Primary Examiner—Mary Wilczewski

(57) ABSTRACT

A method of planarizing a dielectric layer comprising the steps of providing a substrate having structures already formed thereon, and then forming a borophosphosilicate glass layer over the substrate. Next, a rapid thermal process is applied heating the borophosphosilicate layer to cause a thermal flow, and then the borophosphosilicate layer is etched back so that a planar surface is obtained. Finally, a passivation layer is formed over the borophosphosilicate glass layer to prevent the formation of pits in subsequent pre-metal wet etching operations.

14 Claims, 4 Drawing Sheets

METHOD OF PLANARIZING DIELECTRIC LAYER

CROSS-REFERENCE TO RELATED APPLICATION

This application claims the priority benefit of Taiwan application serial No.87103550, filed Mar. 11, 1998, the full disclosure of which is incorporated herein by reference.

BACKGROUND OF THE INVENTION

1. Field of Invention

The present invention relates to a method of manufacturing semiconductors. More particularly, the present invention relates to a method of planarizing a borophosphosilicate glass (BPSG) dielectric layer.

2. Description of Related Art

Planarization is one of the most important steps in semiconductor fabrication. When the line width of semiconductors decreases to 2.0 μm or lower, difference in height levels across a wafer surface due to device miniaturization is going to increase. To ensure proper pattern transfer of conductive lines so that subsequent metallization operations can be performed without much interference, topographical variation across wafer surface must be dealt with by planarization. At present, the question of how to form a good planar surface on a wafer is still a major challenge for VLSI manufacturing engineers.

Borophosphosilicate glass (BPSG) is a dielectric material commonly used for planarizing a wafer surface before metallization. The composition of BPSG includes boron, phosphorus and silicon dioxide. BPSG is formed over a silicon wafer by the introduction of gases that contain boron and phosphorus while silicon dioxide is deposited. In general, BPSG contains about 1 to 4% boron by weight and about 4 to 6% phosphorus by weight. With this percentage of boron and phosphorus in the BPSG, the glass transition temperature necessary for thermal flow can be lowered to about 950° C., and sometimes can be below 850° C. In addition, the BPSG is able to absorb moisture from the air.

FIGS. 1A through 1D are cross-sectional views showing the progression of manufacturing steps for the purpose of using BPSG as an inter-layer dielectric (ILD) in integrated circuit fabrication according to a conventional method. First, as shown in FIG. 1A, a substrate 100 is provided. Then, conductive lines or a MOS transistor having a gate 105 is formed on the substrate 100, and source/drain regions 106 and device isolation regions 102 are formed in the substrate 100. Next, an atmospheric pressure chemical vapor deposition (APCVD) method is used to form a borophosphosilicate glass (BPSG) layer 110 over the substrate 100 structure.

Next, as shown in FIG. 1B, the BPSG layer 110 on the wafer surface is heated to about 850° C. to perform a thermal flow operation. The thermal flow operation is able to smooth the top surface of the borophosphosilicate glass layer 110a a bit further. Moreover, the boron and phosphorus dopants inside the BPSG material can be more uniformly distributed by this operation.

Next, as shown in FIG. 1C, an etching back operation is carried out to remove a portion of the borophosphosilicate glass layer 110a so that a much more planar borophosphosilicate glass layer 110b is obtained. Next, using conventional photolithographic and etching techniques, the BPSG layer 110b is patterned to form a contact opening 112 exposing one of the source/drain regions 106.

Next, as shown in FIG. 1D, an RCA cleaning solution is used to remove any residual photoresist or particles left after patterning the BPSG layer 110b. Subsequently, a pre-metal etching (PME) operation, normally a wet etching operation, is conducted to remove any native oxide on the exposed source/drain region 106. Finally, a metallic layer 114 is formed over the substrate 100, filling the contact opening 112 and making electrical contact with the source/drain region 106.

As the level of integration, for integrated circuits increases, the dimensions of each device become smaller. Consequently, the thermal budget of each thermal operation must be reduced correspondingly. To reduce thermal budget, rapid thermal process (RTP) are often used in the aforementioned thermal flow process. Although RTP is capable of planarizing a BPSG layer, it is incapable of uniformly distributing boron and phosphorus dopants inside the BPSG layer. An increase in boron or phosphorus concentration in any part of a borophosphosilicate glass layer is able to increase the wet etching rate of silicon oxide at that point. Therefore, uneven distribution of boron or phosphorus dopants inside a borophosphosilicate glass layer will result in the formation of pits after a PME or cleaning with RCA solution, such as the region 120 as shown in FIG. 1D. The formation of pits may cause severe problems in subsequent processing operations, and may lead to a change in electrical properties. Alternatively, the percentages of dopants in a BPSG layer can be purposely reduced so that less pits are formed. However, dopants reduction will increase the glass transition temperature of the borophosphosilicate glass layer, thus increasing thermal budget and thus compromising the ultimate planarity of the layer.

In light of the foregoing, there is a need to provide an improved method of planarizing the dielectric layer.

SUMMARY OF THE INVENTION

Accordingly, the present invention provides a method of planarization using a borophosphosilicate glass (BPSG) dielectric layer. The method is capable of preventing the formation of pits on a BPSG surface in pre-metal etching, but does not necessitate a reduction in the percentages of dopants inside the BPSG layer.

In another aspect, this invention provides a method of planarization using a borophosphosilicate glass (BPSG) dielectric layer. The method utilizes a rapid thermal process to generate the necessary heat for thermal flow of a borophosphosilicate glass layer, thereby reducing the overall thermal budget.

To achieve these and other advantages and in accordance with the purpose of the invention, as embodied and broadly described herein, the invention provides a method of planarization using a borophosphosilicate glass (BPSG) dielectric layer. The method comprises the steps of providing a substrate having structures already formed thereon, and then forming a borophosphosilicate glass layer over the substrate. Next, a rapid, thermal process is applied to heat the borophosphosilicate layer and cause a thermal flow, and then the borophosphosilicate layer is etched back so that a planar surface is obtained. Finally, a passivation layer is formed over the borophosphosilicate glass layer to prevent the formation of pits in subsequent pre-metal wet etching operation.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
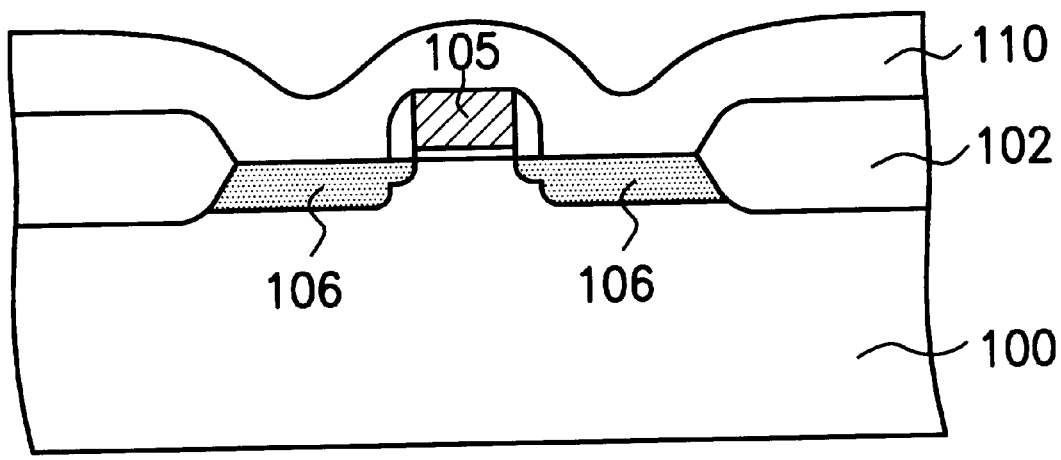
FIGS. 1A through 1D are cross-sectional views showing the progression of manufacturing steps in using BPSG as an inter-layer dielectric (ILD) in integrated circuit fabrication according to a conventional method.
Figure 1B:
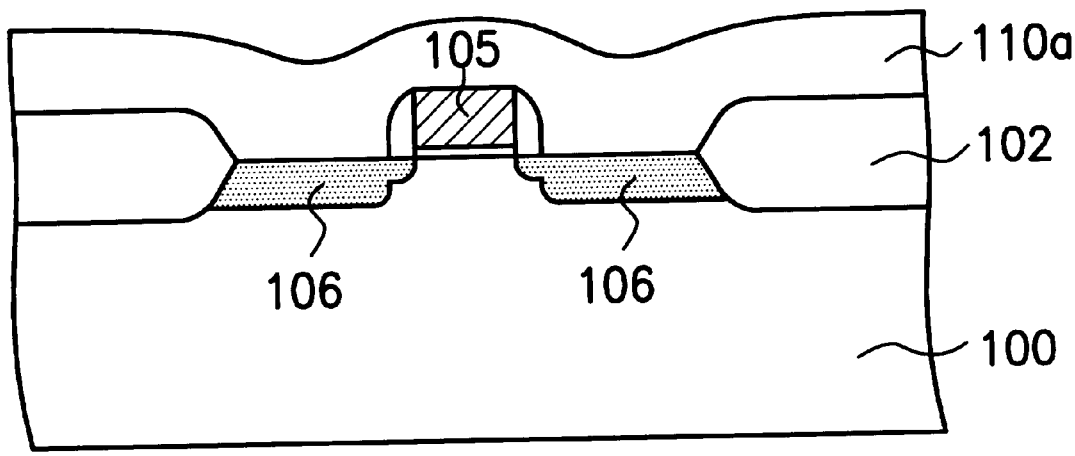
Figure 1C:
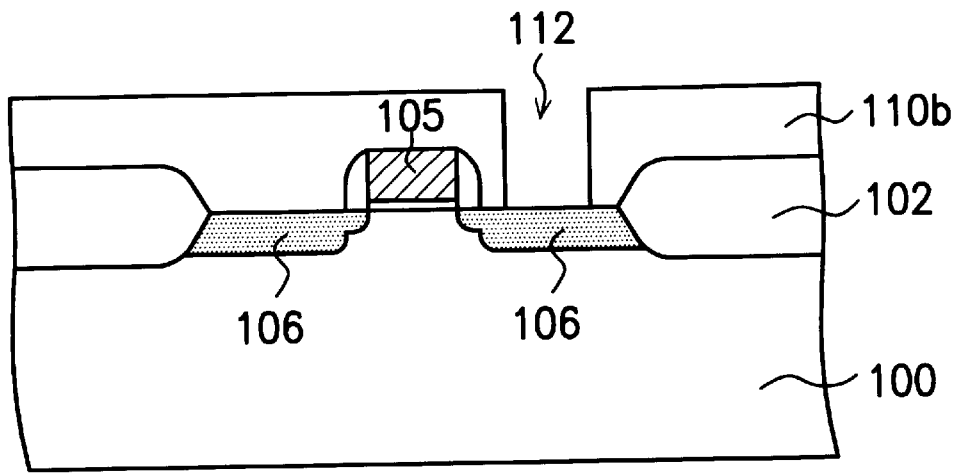
Figure 1D:
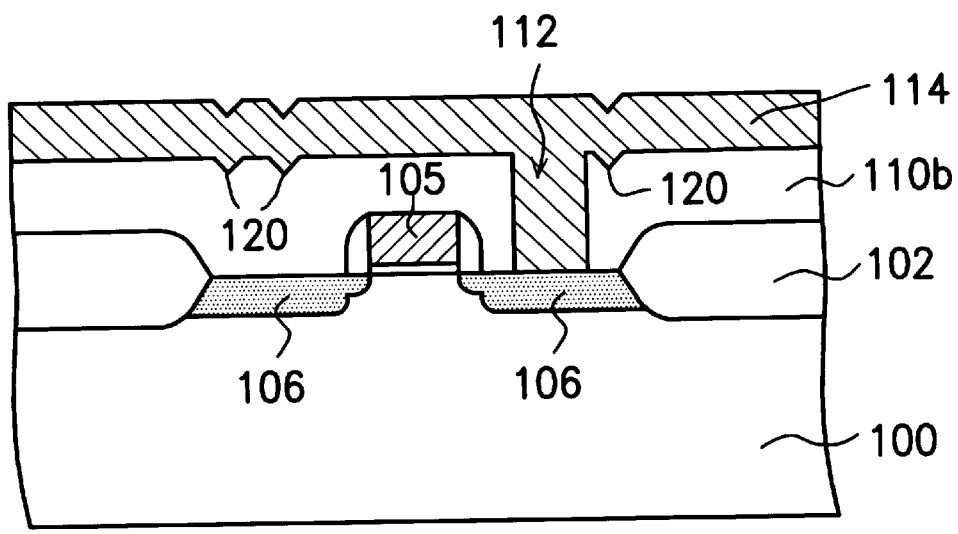

Reference will now be made in detail to the present preferred embodiments of the invention, examples of which are illustrated in the accompanying drawings. Wherever possible, the same reference numbers are used in the drawings and the description to refer to the same or like parts.

Figure 2A:
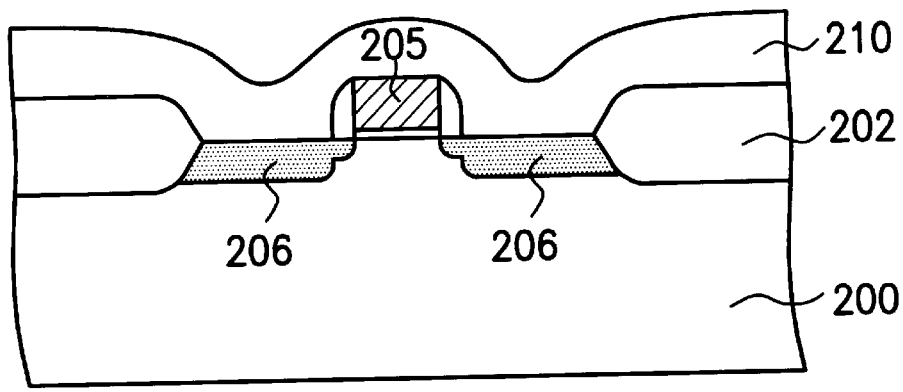
FIGS. 2A through 2E are cross-sectional views showing the progression of manufacturing steps in using BPSG as an inter-layer dielectric (ILD) in integrated circuit fabrication according to one preferred embodiment of this invention.

FIGS. 2A through 2E are cross-sectional views showing the progression of manufacturing steps in using BPSG as an inter-layer dielectric (ILD) in integrated circuit fabrication according to one preferred embodiment of this invention. First, as shown in FIG. 2A, a substrate 200 is provided. Then, conductive lines or a MOS transistor having a gate 205 are formed on the substrate 200, and source/drain regions 206 and device isolation regions 202 are formed in the substrate 200. Next, a plasma-enhanced chemical vapor deposition (PECVD) method or an atmospheric pressure chemical vapor deposition (APCVD) method is used to form a dielectric layer 210 over the substrate 100 structure. The dielectric layer 210, preferably having a thickness of about 1000 Å to 2000 Å, can be made from a borophosphosilicate glass (BPSG) or a phosphosilicate glass (PSG) layer.

Figure 2B:
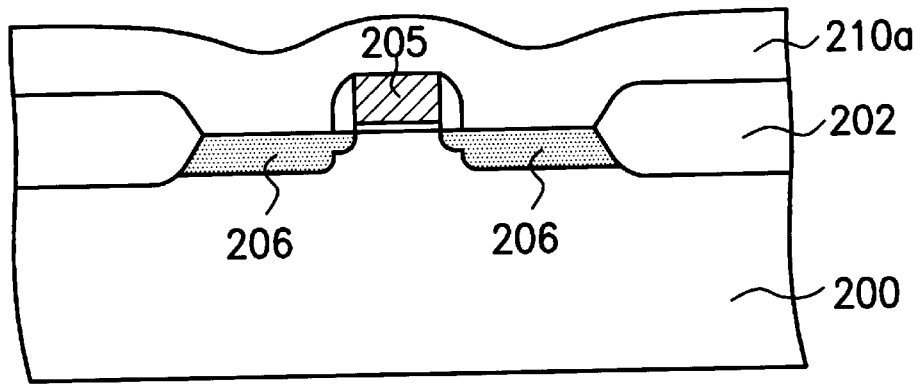

Next, as shown in FIG. 2B, thermal flow is carried out by heating the dielectric layer 210 to about 850° C. so that a smoother dielectric layer 210a over the silicon wafer is obtained. To further reduce thermal budget of the device, it is preferable to use a rapid thermal process (RTP) for the high-temperature thermal flow.

Figure 2C:
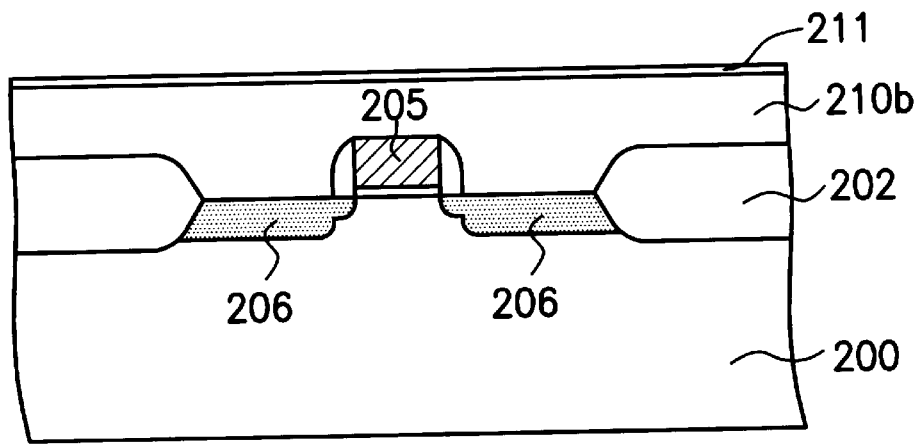

Thereafter, as shown in FIG. 2C, an etching-back operation is performed to remove a portion of the dielectric layer 210a so that a more planar dielectric layer 210b is obtained. Then, a passivation layer 211 is formed over the dielectric layer 210b using, for example, a low-pressure chemical vapor deposition (LPCVD) method. The passivation layer 211 can be a silicon oxide layer and preferably has a thickness of about 100 Å to 500 Å.

Figure 2D:
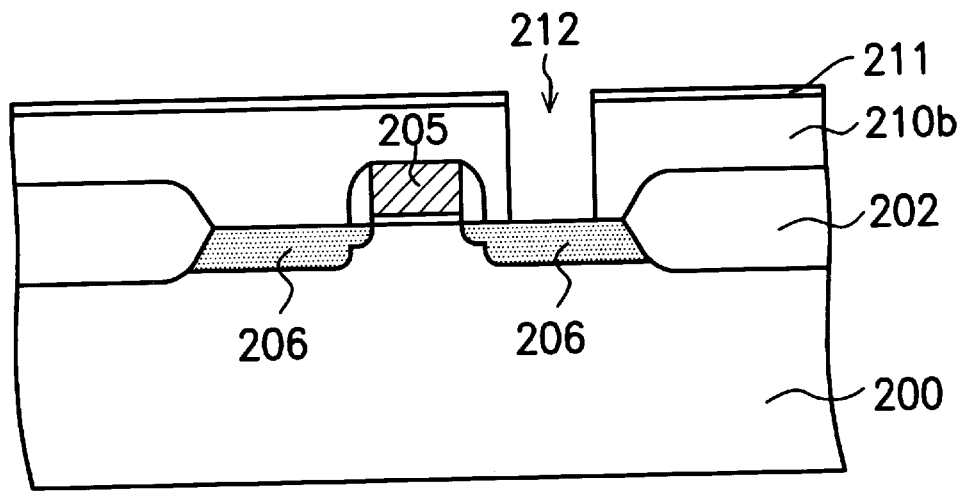

Subsequently, as shown in FIG. 2D, conventional photolithographic and etching processes are used to pattern the passivation layer 211 and the dielectric layer 210b, and to form a contact opening 212 that exposes one of the source/drain regions 206.

Figure 2E:
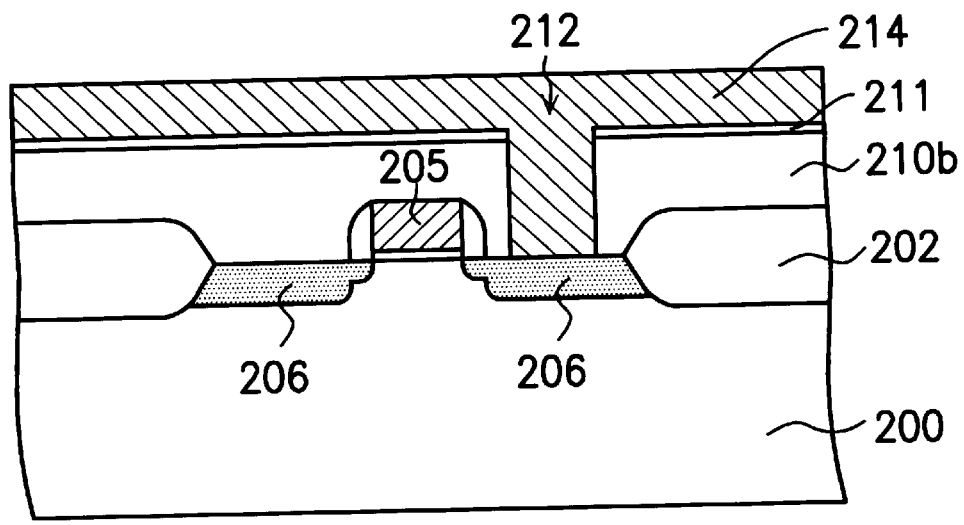

Next, as shown in FIG. 2E, an RCA cleaning solution is used to remove residual photoresist and particles on the surface of the structure. Then, a pre-metal etching (PME), normally a wet etching operation, is used to remove native oxide on the exposed source/drain region 206. Finally, a metallic layer 214 is formed over the substrate 200 filling the contact opening 212 and making electrical connection with the source/drain region 206. Since the dielectric layer 210b is covered by a protective passivation layer 211, formation of pits on the borophosphosilicate glass (or phosphosilicate glass) dielectric layer during pre-metal etching due to a non-uniform distribution of dopants is avoided.

In summary, this invention utilizes a rapid thermal process to carry out the necessary thermal flow of a BPSG dielectric layer and hence able to reduce the thermal budget during this process. Although a rapid thermal process is unable to distribute dopants evenly in the BPSG layer, pits will not form on the BPSG layer in subsequent PME operation due to the presence of a protective passivation layer over the BPSG layer. Therefore, this invention is capable of obtaining a good planar surface and preventing the formation of pits on BPSG surface without having to reduce percentages of dopants inside the BPSG layer. Hence, this invention has potential applications in high level integration of integrated circuits and associated structures.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of planarizing a dielectric layer comprising the steps of:

providing a substrate;

forming a doped dielectric layer over the substrate;

performing an etching back step to planarize the doped dielectric layer;

forming a passivation layer upon the doped dielectric layer said passivation layer having a thickness of about 100–500 angstroms so that a surface of the doped dielectric layer is prevented from being damaged;

patterning the passivation layer and the doped dielectric layer to form a contact opening, wherein the contact opening exposes a part of the substrate;

performing a pre-metal etching upon the substrate; and forming a metallic layer over the substrate and filling the contact opening.

2. The method of claim 1, wherein the step of forming the doped dielectric layer includes depositing borophosphosilicate glass.

3. The method of claim 1, wherein the step of forming the doped dielectric layer includes depositing phosphosilicate glass.

4. The method of claim 1, wherein after the step of forming the doped dielectric layer further includes a high-temperature thermal flow operation.

5. The method of claim 4, wherein after performing the high-temperature thermal flow operation further includes an etching back operation.

6. The method of claim 4, wherein the step of performing the high-temperature thermal flow includes using a rapid thermal process.

7. The method of claim 6, wherein after performing the high-temperature thermal flow operation further includes an etching back operation.

8. The method of claim 1, wherein the step of forming the passivation layer includes depositing silicon oxide.

9. A method of planarizing a dielectric layer comprising the steps of:

providing a substrate;

forming a borophosphosilicate glass layer over the substrate, said borophosphosilicate glass layer having a non-uniform distribution of dopants;

performing an etching back step to planarize the borophosphosilicate glass layer;

forming a passivation layer over the borophosphosilicate layer, said passivation layer having a thickness of about 100–500 angstroms so that, during a subsequent pre-metal etching, a surface of the borophosphosilicate glass layer is prevented from being damaged;

patterning the passivation layer and the borophosphosilicate glass layer to form a contact opening, said contact opening exposing a part of the substrate;

performing the pre-metal etching upon the substrate; and forming a metallic layer over the substrate and filling the contact opening.

10. The method of claim 9, wherein after the step of forming the borophosphosilicate glass layer further includes a high-temperature thermal flow operation.

11. The method of claim 10, wherein after performing the high-temperature thermal flow operation further includes an etching back operation.

12. The method of claim 10, wherein the step of performing the high-temperature thermal flow includes using a rapid thermal process.

13. The method of claim 12, wherein after performing high-temperature thermal flow operation further includes an etching back operation.

14. The method of claim 9, wherein the step of forming the passivation layer includes depositing silicon oxide.

* * * * *